United States Patent [19]

Miyazaki

[11] Patent Number: 5,408,195
[45] Date of Patent: Apr. 18, 1995

[54] FM DEMODULATION CIRCUIT
[75] Inventor: Shinichi Miyazaki, Tokyo, Japan
[73] Assignee: NEC Corporation, Tokyo, Japan
[21] Appl. No.: 10,001
[22] Filed: Jan. 27, 1993
[30] Foreign Application Priority Data
  Jan. 27, 1992 [JP] Japan ................... 4-034009
[51] Int. Cl.6 .............. H03D 3/00; H03D 3/28; H03L 1/02; H03L 7/00
[52] U.S. Cl. ................. 329/325; 329/318; 331/23; 331/175
[58] Field of Search ............... 329/318, 325, 302, 326; 331/17, 23, 15, 34, 175, 178, 177 V, 177 R, 44; 455/337; 375/81

[56] References Cited
U.S. PATENT DOCUMENTS 3,411,103 11/1968 Deman et al. ............. 331/17 X
3,495,184 2/1970 Perkins et al. ............. 331/17 X
4,107,624 8/1978 Turner ..................... 329/326 X
4,568,888 2/1986 Kimura et al. ............. 331/17 X
4,980,652 12/1990 Tarusawa et al. .......... 331/17 X
5,168,246 12/1992 Pulluru et al. ............. 331/17 X Primary Examiner—David Mis
Attorney, Agent, or Firm—Foley & Lardner

[57] ABSTRACT

An FM demodulation circuit comprises, an oscillation circuit (3) whose oscillation frequency is varied by a control signal, a phase comparator means (2) for comparing phases of signals between an FM signal to be demodulated and the output signal of the oscillation circuit (3) and generating a comparison signal corresponding to the phase difference, an additional voltage determining circuit (7) for determining an additional voltage based upon the comparison signal, and an adder (5) for adding the comparison signal and the additional voltage, and supplying the added result as the control voltage. The additional voltage may be a value which makes the comparison signal level at a center level of the operable range of the phase comparator (2).

11 Claims, 4 Drawing Sheets

FM DEMODULATION CIRCUIT

BACKGROUND OF THE INVENTION

The present invention relates to an FM demodulation circuit, more specifically to an FM demodulation circuit using PLL circuit.

In recent years, the mobile vehicle communication system utilizing FM modulation has been widely employed. From the view point of miniaturization requirement for portability of the radiowave equipment, LSI technology has rapidly progressed. This tendency is also seen in FM demodulation circuit. The FM demodulation circuit using PLL has been popular with the progress of LSI technology and may be established by the process of C-MOS and the like suitable for LSI technology.

The conventional FM demodulation circuit using PLL will be described by reference to FIG.2. In FIG.2, an FM signal supplied from a signal input terminal 1 is inputted to a phase comparator 2 to detect a phase difference between the frequencies of the input signal from a comparison signal oscillator 3 and the FM signal. A comparison detection signal corresponding to the phase difference is sent to the comparison signal oscillator 3 to make a coincidence between the phase of the oscillation frequency signal of the comparison signal oscillator 3 and that of the FM signal, The comparison detection signal obtained in the phase comparator 2 is the DC voltage corresponding to the modulated frequency of the FM signal and is outputted from a demodulation signal output terminal 4 as the FM demodulation signal.

In such conventional FM demodulation circuit, it is required that the oscillation frequency of the comparison signal oscillator 3 is coincident with the frequency of the FM signal to be demodulated. However, if a frequency variable range of this oscillation deviates due to, for example, temperature rise, the frequencies will not be coincident owing to a limitation of the comparison detection signal (DC voltage) from the phase comparator 2, causing a distortion in the FM demodulation signal.

FIG.3 shows relationships between the comparison detection signal (corresponding to the oscillation frequency voltage) and the oscillation frequency for two conditions, i.e., the normal condition of the normal variable range of the oscillation and the deviation condition from the normal condition. In the normal condition as shown in FIG.3A, the accurate comparison detection voltage may be obtained depending upon the frequency of the FM signal to be demodulated. However, when the deviation occurs as shown in FIG. 3B, the frequencies are not coincident and the comparison detection signal reaches the limit value due to the nonlinear characteristics, causing the distortion in the comparison detection signal (demodulated signal).

More concretely, it is assumed now that the output voltage range generated from the phase comparator 2 is +1 to +4 V. Normally, when a power source voltage for exciting the phase comparator 2 is +5 V, the phase comparator 2 is capable of generating the output voltages of +1 V to +4 V.

Referring to FIG. 3A illustrating the normal characteristic at tile room temperature, the oscillation frequency varies from −16 kHz to +24 kHz with the frequency control input terminal voltage of +0 V to +5 V for the carrier frequency 455 kHz. When the modulation frequency range of the FM demodulation signal to be FM demodulated is −8 kHz to +8 kHz, the frequency control signal voltage (output voltage of the phase comparator 2) ranges from +1 V to +3 V. On the other hand, as shown in FIG. 3B, when the characteristic of the comparison signal oscillator 3 deviates due to the external condition change such as the temperature rise, tile voltage range of +0.5 V to +2.5 V is required as the frequency control signal for accurate response to the modulation frequency range of −8 kHz to +8 kHz.

However, since the phase comparator 3 can not generate the voltage lower than +1 V, the demodulation signal is maintained at +1 V for the frequency range from 455 kHz −4 kHz to 455 kHz −8 kHz of the signal to be FM demodulated, resulting in the demodulation signal distortion.

In order to solve this problem, it is required to adjust the respective oscillation frequency characteristic of the comparison signal oscillators. However, there has been no LSI circuit equipped with means for adjusting the respective deviations of the comparison signal oscillators.

SUMMARY OF THE INVENTION

It is therefore an object of the present invention to provide an FM demodulation circuit capable of eliminating the deterioration of the linear demodulation characteristics due to the deviation of the oscillation frequency, and of adjusting the respective characteristic deviations of the comparison signal oscillators.

According to the present invention there is provided an FM demodulation circuit comprising, an oscillation circuit means whose oscillation frequency is variable by a control signal, a phase comparator means for comparing phases of signals between an FM signal to be demodulated and the output signal of the oscillation circuit means and generating a comparison signal corresponding to the phase difference, an additional voltage determining means for determining an additional voltage based upon the comparison signal, and an adder means for adding the comparison signal and the additional voltage, and supplying the added result as the control voltage.

The additional voltage determining means may comprise an A/D converter for converting the comparison signal into a digital signal, memory for storing the determined additional voltage data, and a D/A converter for converting the additional voltage data read out from the memory into an analogue signal, and supplying the converted analogue signal to the adder means.

The additional voltage may be a value which makes the comparison signal level at a center level of the operable range of the phase comparator means or a difference value between a center level of the operable range of the phase comparator means and the obtained comparison signal from the phase comparator means when a carrier signal without being modulated is inputted in the phase comparator means.

Other objects and features of the invention will be clarified from the following description with reference to the attached drawings.

DESCRIPTION OF PREFERRED EMBODIMENTS

Figure 1:
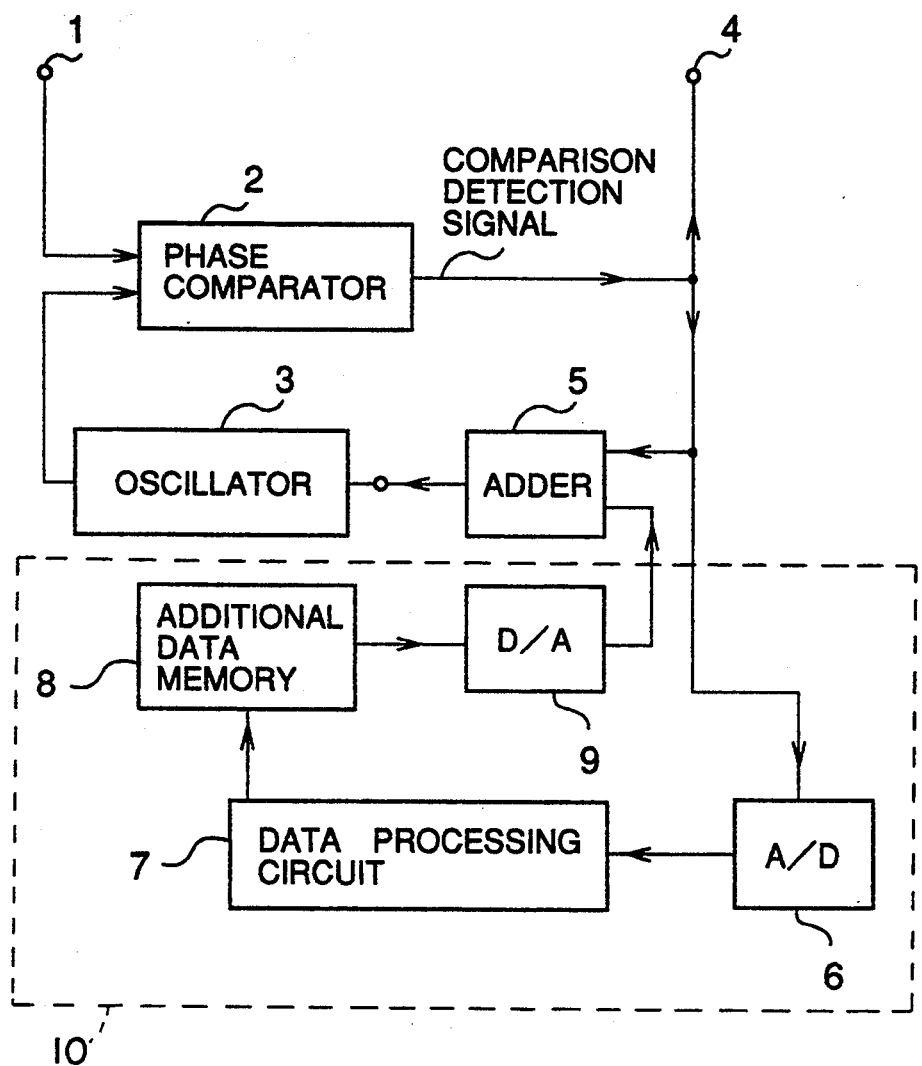
FIG.1 is a block diagram illustrating one embodiment of a FM demodulation circuit according to the present invention.
Figure 2:
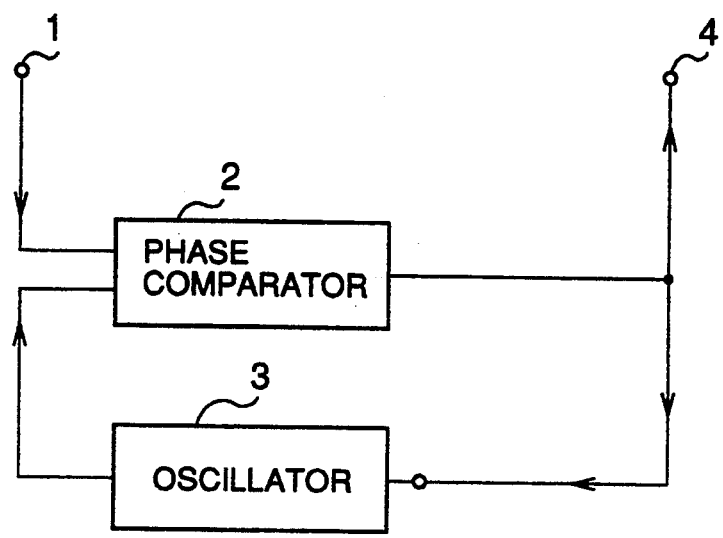
FIG. 2 is an example of a block diagram of the conventional FM demodulation circuit.

The present invention will be described in detail hereunder with reference to the accompanied drawings. Illustrated in FIG. 1 is a block diagram of an embodiment according to the present invention. The signal input terminal 1, the phase comparator 2, tile comparison signal oscillator 3, and the demodulation signal output terminal 4 are the same as those in tile conventional circuit shown in FIG. 2. An adder 5 is inserted into the input side of the comparison signal oscillator 3. To the inputs of the adder 5 supplied with the comparison detection signal from the phase comparator 2 and data signal from an additional voltage determining circuit 10. The additional voltage determining circuit 10 comprises an A/D converter 6, a data processing circuit 7, an additional data memory 8, and a D/A converter 9.

The adder 5 adds the DC voltage from the D/A converter 9 and the comparison detection signal from the phase comparator 2, and outputs the added result to the frequency control signal Input terminal of the comparison signal oscillator 3. The A/D converter 6 converts the comparison detection signal into the digital data signal and sends the digital data signal to the data processing circuit 7. The required additional voltage to obtain an appropriate comparison detection signal is determined based upon the input data signal in the data processing circuit 7, and is stored in the additional data memory 8. From the additional data memory 8, the stored appropriate data signal is supplied to the D/A converter 9. The D/A converter 9 converts the additional voltage read out from the additional data memory 8 into the analog signal, and outputs it to the adder 5.

According to the above circuit, if no additional voltage exists (0 V), the comparison detection signal is supplied to the frequency control input terminal of the comparison signal oscillator 3, and the similar operation is executed. On the other hand, if the deviation of the oscillation frequency of the comparison signal oscillator 3 is caused and the voltage signal higher than the limit value of the comparison detection signal is required, the appropriate additional voltage is determined in the data processing circuit 7 and is added to the comparison detection signal by the adder 5. The comparison signal oscillator 3 operates by tills additional voltage. According to the foregoing operation, the oscillation frequency of the comparison signal oscillator 3 is made coincident with that of the FM signals, eliminating the distortion of the demodulated signal.

It is to be noted here that the voltage at frequency control input terminal of tile comparison signal oscillator 3 becomes higher as much as the additional voltage when the additional voltage is added to the comparison detection signal. On the contrary, the FM signal is compared with the output of the comparison signal oscillator 3 in the phase comparator 2, therefore the generated FM signal and the output of the comparison signal oscillator 3 become lower as much as tile amount of the additional voltage. That is, the comparison detection signal varies inversely as much as the amount of the additional voltage. The additional voltage may be determined as a value which makes tile comparison detection signal level; at a center level of tile operable range of the phase comparator 2 when the carrier signal without being modulated is inputted in the phase comparator 2.

Figure 3A:
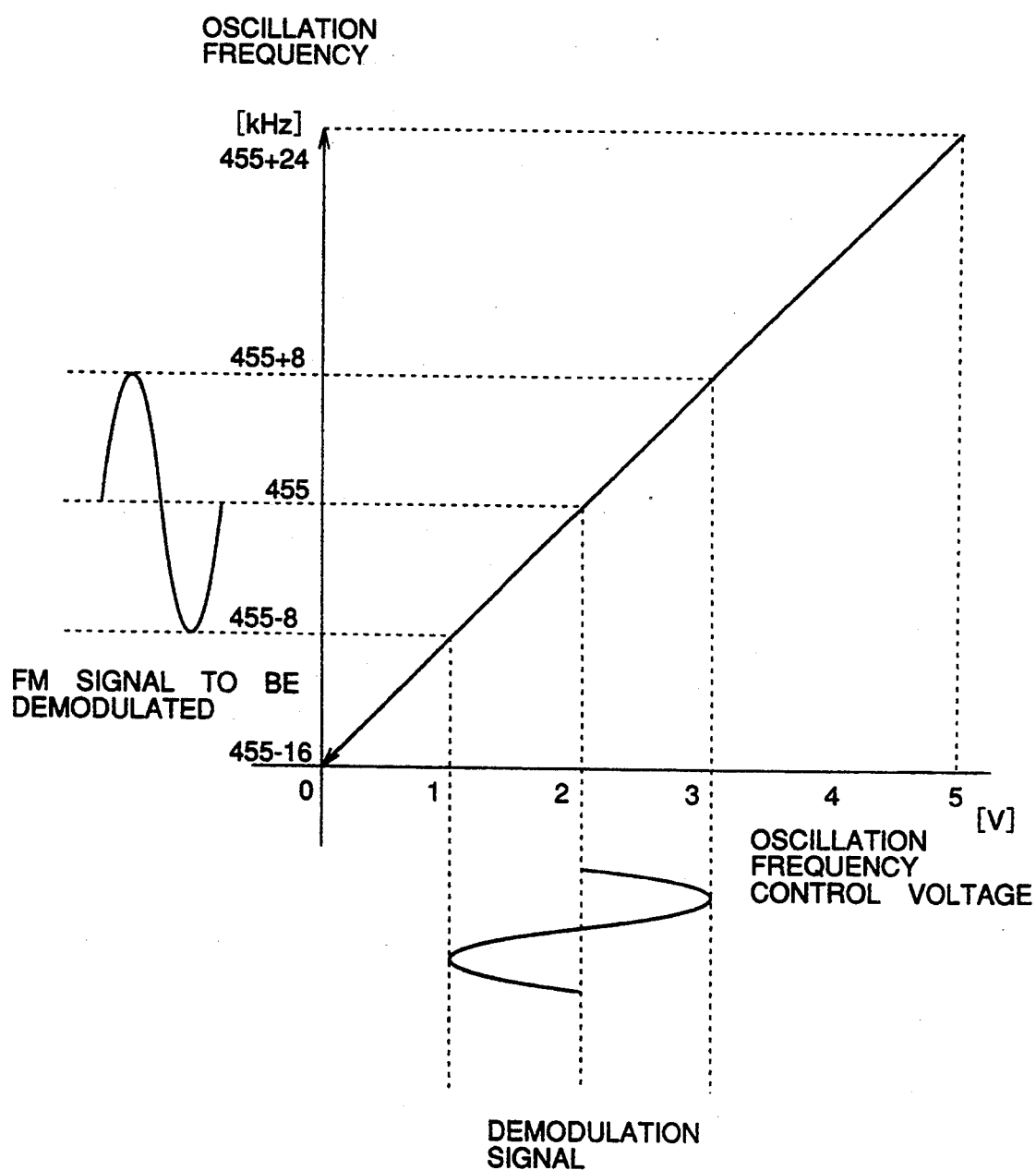
FIG. 3A and 3B are graphs showing the demodulation characteristic in the case that tile oscillation frequency characteristic is deviated from tile normal operation characteristic.
Figure 3B:
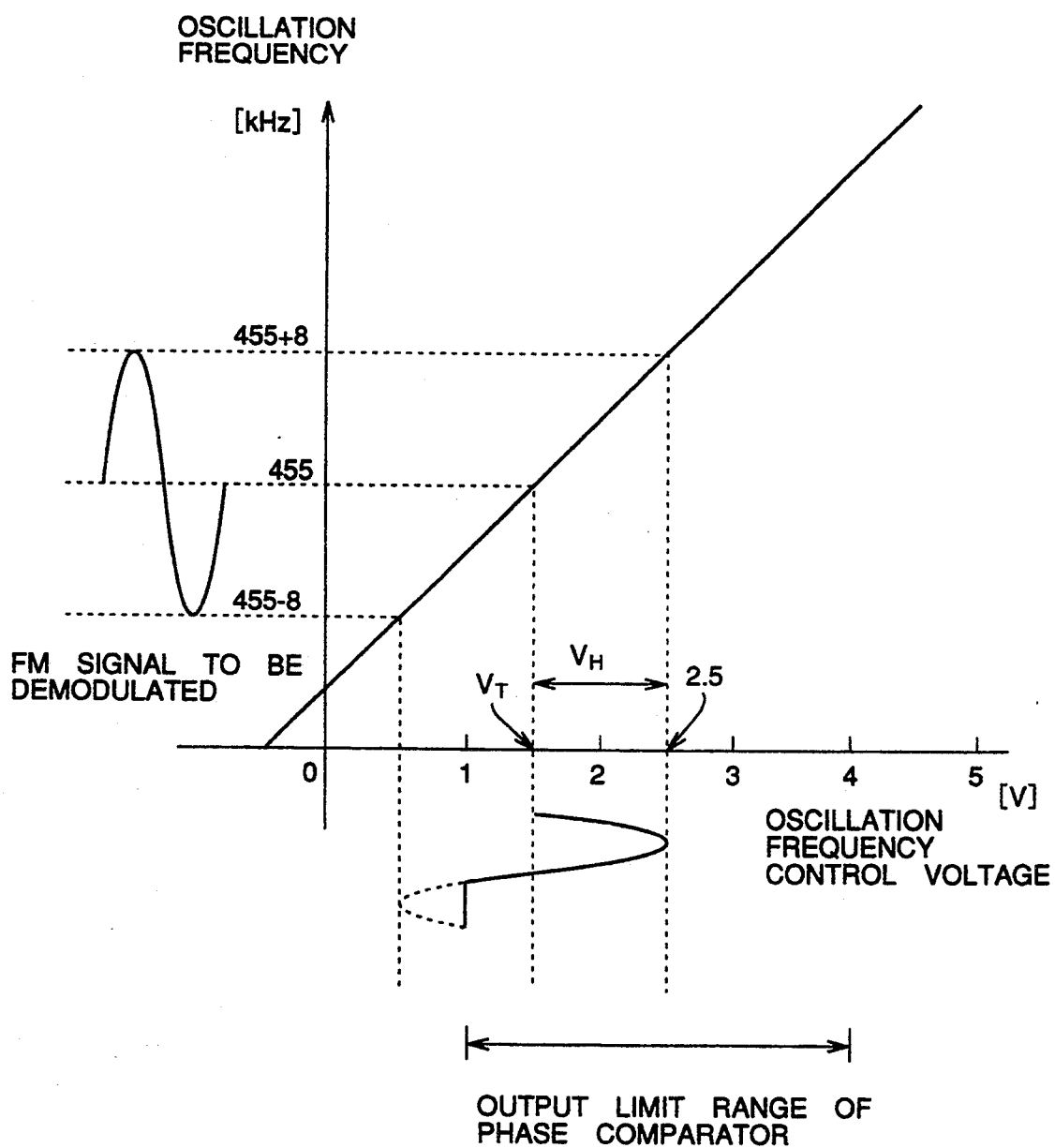

More specifically, in the foregoing case with reference to FIGS. 3A and 3B, the output range of +1.5 V to +3.5 V of the phase comparator 2 at the room temperature is obtained by adding −0.5 V to tile comparison detection signal in the adder 5. As a result, the control with the voltage of +1 V to +3 V is realized under the deviation of 0.5 V in the oscillation frequency due to the temperature change is caused, eliminating the demodulation signal distortion. Thus, even if the voltage becomes higher than the limit value of the comparison detection signal due to the oscillation frequency deviation of the comparison detection signal, the demodulation distortion is eliminated by adding the appropriate additional voltage.

The determination process of the additional voltage in the data processing circuit 7 will be explained hereunder. As the initial set for the adjustment, inputted to the signal input terminal 1 is the carrier signal without being modulated having a center modulation frequency of 455 kHz. At that time, the output voltage VT from the phase comparator 2 is supplied to the data processing circuit 7 through the A/D converter 6. The data processing circuit 7 determines the additional voltage VH using the voltage VT so as to set the output voltage of the phase comparator 2 at +2.5 V which is a center level, or voltage of the range +1 V to +4 V, i.e., VH = +2.5 − VT. The determined additional voltage VH is memorized in the additional data memory 8. In the normal demodulation operation the voltage VH read out from the memory 8 is supplied to the adder 5 through the D/A converter 9.

As described in the foregoing, the present invention improves the limitation of the operable range of the phase comparator 2 due to the oscillation frequency deviation of the comparison signal oscillator 3 by adding the additional voltage to the comparison detection signal, maintaining the linear demodulation characteristics. Providing the circuit to memorize the additional voltage adjusts the individual deviation of the comparison signal oscillator 3.

What is claimed is:

1. An FM demodulation circuit comprising: an oscillation circuit whose oscillation frequency is varied by a control signal;

a phase comparator means for comparing a phase of an FM signal to be demodulated and a phase of the an output signal of said oscillation circuit and for generating a comparison signal corresponding to a phase difference between said FM signal and said output signal;

an additional voltage determining means for determining an additional voltage based upon said comparison signal; and an adder means for adding said comparison signal and said additional voltage, and supplying the added result as said control signal.

2. The FM demodulation circuit as set forth in claim 1 wherein said additional voltage determining means comprises, an analogue/digital (A/D) converter for converting said comparison signal into a digital signal, memory for storing determined additional voltage data corresponding to the determined additional voltage, and a digital/analogue (D/A) converter for converting the determined additional voltage data read out from said memory into an analogue signal, and supplying the converted analogue signal to said adder.

3. The FM demodulation circuit as set forth in claim 1, wherein said additional voltage determining means determines the additional voltage as a value which makes the comparison signal level at a center level of the operable range of said phase comparator means.

4. The FM demodulation circuit as set forth in claim 1, wherein said additional voltage is determined as a difference value between a center level of the operable range of said phase comparator means and the obtained comparison signal from said phase comparator means when carrier signals without being modulated are inputted in said phase comparator means.

5. A frequency modulated (FM) demodulation circuit for demodulating an FM signal comprising:
  an oscillation circuit outputting a reference signal whose oscillation frequency is varied by a control signal;
  a phase comparator for determining a phase difference between said FM signal and said reference signal and generating a comparison signal corresponding to said phase difference;
  an additional voltage determining circuit for determining an additional voltage based on said comparison signal; and
  an adder receiving and summing said comparison signal and said additional voltage and providing an output signal as said control signal.

6. The FM demodulation circuit as set forth in claim 5 wherein said additional voltage determining circuit comprises:
  an analog/digital (A/D) converter for converting said comparison signal into a digital signal;
  memory for storing a value of said additional voltage; and
  a digital/analog (D/A) converter for converting said value of said additional voltage read out from said memory into an analogue signal and supplying the analogue signal to said adder.

7. The FM demodulation circuit as recited in claim 5 wherein said additional voltage determining circuit determines said additional voltage as a value which causes said reference signal to oscillate at a frequency such that a zero level of said comparison signal is at a center level of an operable range of said phase comparator.

8. The FM demodulation circuit as recited in claim 5 wherein said additional voltage is determined as a difference value between a center level of an operable range of said phase comparator and said comparison signal from said phase comparator obtained when nonmodulated carrier signals are input into said phase comparator.

9. A method of demodulating an FM signal comprising the steps of:
  outputting a reference signal from an oscillation circuit whose oscillation frequency is varied by a control signal;
  determining a phase difference between said FM signal and said reference signal in a phase comparator and generating a comparison signal corresponding to said phase difference;
  determining an additional voltage based upon said comparison signal; and
  adding said comparison signal and said additional voltage in an adder and providing an output signal from said adder as said control signal.

10. The method as recited in claim 9 further comprising the step of determining said additional voltage as a value which causes said reference signal to oscillate at a frequency such that a center voltage level of said comparison signal is at a center level of an operable range of said phase comparator.

11. The method as recited in claim 9 further comprising the step of determining said additional voltage as a difference value between a center level of an operable range of said phase comparator and said comparison signal obtained from said phase comparator, said difference value being obtained when nonmodulated carrier signals are input to said phase comparator.

* * * * *